United States Patent
Robert

(10) Patent No.: US 9,532,448 B1
(45) Date of Patent: Dec. 27, 2016

(54) POWER ELECTRONICS MODULES

(71) Applicant: FORD GLOBAL TECHNOLOGIES, LLC, Dearborn, MI (US)

(72) Inventor: Brian Joseph Robert, St. Clair Shores, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/059,465

(22) Filed: Mar. 3, 2016

(51) Int. Cl.
| | |
|---|---|
| *H01L 23/48* | (2006.01) |
| *H01L 23/52* | (2006.01) |
| *H01L 29/40* | (2006.01) |
| *H05K 1/05* | (2006.01) |
| *H05K 1/02* | (2006.01) |

(52) U.S. Cl.
CPC .............. *H05K 1/05* (2013.01); *H05K 1/0203* (2013.01); *H05K 1/0296* (2013.01); *H05K 2201/066* (2013.01); *H05K 2201/10166* (2013.01); *H05K 2201/10174* (2013.01)

(58) Field of Classification Search
CPC ...... H01L 23/3142; H01L 24/73; H01L 24/91; H01L 23/49513
USPC .................... 257/782, 783, 706, 707, 691
See application file for complete search history.

(56) References Cited

U.S. PATENT DOCUMENTS

| | | | | |
|---|---|---|---|---|
| 5,236,630 A * | 8/1993 | Arima | ...................... | H01B 1/22 106/1.05 |
| 6,723,379 B2 * | 4/2004 | Stark | ..................... | B81B 7/0067 257/E31.117 |
| 8,023,269 B2 | 9/2011 | Mitchell et al. | | |
| 8,414,977 B2 | 4/2013 | Ikejiri | | |
| 8,916,892 B2 * | 12/2014 | Jo | ........................ | H01L 27/1218 257/98 |
| 2002/0090814 A1 * | 7/2002 | Inoue | .................. | H01L 21/2885 438/672 |
| 2004/0065432 A1 | 4/2004 | Smith et al. | | |
| 2006/0108601 A1 * | 5/2006 | Okamoto | .................. | C23C 4/02 257/177 |
| 2007/0114676 A1 * | 5/2007 | Anderson | ........... | H01L 23/3107 257/787 |
| 2008/0128664 A1 * | 6/2008 | Kitae | ..................... | H05K 3/323 252/512 |
| 2010/0041228 A1 * | 2/2010 | Okamoto | ............ | H01L 23/3735 438/622 |
| 2010/0055839 A1 * | 3/2010 | Nikitin | .............. | H01L 23/49513 438/113 |
| 2011/0084369 A1 * | 4/2011 | Eder | ................... | H01L 21/4867 257/666 |

(Continued)

OTHER PUBLICATIONS

Burress, Tim, "Benchmarking EV and HEV Technologies", Oak Ridge National Laboratory, U.S Department of Energy, Jun. 17, 2014 (22 pages).

(Continued)

*Primary Examiner* — S. V. Clark
(74) *Attorney, Agent, or Firm* — David B. Kelley; Brooks Kushman P.C.

(57) ABSTRACT

A power electronics module including an insulated patterned metal substrate, a semiconductor bonded to the substrate, and an agglomeration of solid metal particles mechanically bound to each other and the substrate and arranged to form electrical interconnects between the semiconductor and a bus bar, a control board, a sensor, or a combination thereof.

20 Claims, 6 Drawing Sheets

(56) References Cited

U.S. PATENT DOCUMENTS

2015/0021632 A1* 1/2015 Taghizadeh ............ H05K 1/097
257/88

OTHER PUBLICATIONS

Waye, Scot, "Power Electronics Thermal Management R&D", National Renewable Energy Laboratory (NREL), Jun. 10, 2015 (27 pages).

Yang, Jie, "A Silicon Carbide Wireless Temperature Sensing System for High Temperature Applications," SENSORS 2013, 13, 1884-1901; www.mdpi.com/journal/sensors (18 pages).

McCluskey, Patrick, Power Modulation Investigation for High Temperature (175 degrees C. To 200 degrees C.) Automotive Application, U.S Department of Energy, Oak Ridge National Laboratory, Apr. 2007, (54 pages).

Osterwald, Frank et al., "Sprayed Stress Reducing Interlayers for Highly Reliable Large Solder Joints", (7 pages).

* cited by examiner

POWER ELECTRONICS MODULES

TECHNICAL FIELD

The disclosure relates to power electronics packaging and a method of producing the same.

BACKGROUND

Power electronics modules have been utilized in a variety of industries including electrified vehicles, power plants, industrial machines, as well as in renewable energy applications such as wind turbines, solar power panels, and tidal power plants. A power electronics module provides physical containment for power components as well as non-electrical parts such as electrical interconnects, heat dissipation paths, etc. Traditional electrical interconnects include a number of wire-bonds or ribbon-bonds which may be prone to noise, vibration, or fatigue. Additionally, wire-bonded interconnects place operational temperature restrictions on the module. Further still, as high-temperature devices commercially mature, there is an increased demand for power electronics applications of reduced size, improved reliability, and high temperature tolerance. Yet, modules including the wire-bonded interconnects struggle to meet the rising demands due to spatial limitations.

Alternative methods such as thermal spray deposition have been developed to provide electronic interconnects. Yet, these methods such as arc spray or plasma spray subject the packaging to temperatures of up to 20,000° C. Additionally, bonds between individual components of the module produced by thermal spray deposition may suffer from oxide depositions.

SUMMARY

In at least one embodiment, a power electronics module is disclosed. The module includes an insulated patterned metal substrate and a semiconductor bonded to the substrate. The module further includes an agglomeration of solid metal particles mechanically bound to each other and the substrate which are arranged to form electrical interconnects between the semiconductor and a bus bar, a control board, a sensor, or a combination thereof. An additional agglomeration of solid particles mechanically bound to each other and the substrate via plastic deformation is arranged to form a dielectric material to prevent electrical shorting between the semiconductor and the bus bar, the control board, the sensor, or a combination thereof. The particle-substrate interface associated with the agglomeration may be free of voids and oxide inclusions. The agglomeration may be free of voids, oxide inclusions, or both. The particles may have a lenticular shape. Each of the particles may have a discrete crystalline structure. The semiconductor may be a transistor or a diode.

In another embodiment, a power electronics module is disclosed. The module may include an insulated patterned metal substrate and a semiconductor bonded to the substrate. The module may further include an agglomeration of solid metal particles mechanically bound to each other and the substrate via plastic deformation, and arranged to form a heat sink, a heat spreader, or both in thermal communication with and configured to dissipate heat generated by the semiconductor. The agglomeration may comprise thermal conductivity materials. An additional agglomeration of solid metal particles mechanically bound to each other and the substrate via plastic deformation is arranged to form a high current electrical interconnect, a sensor electrical interconnect, a control electrical interconnect, or a combination thereof. An additional agglomeration of solid particles mechanically bound to each other and the substrate via plastic deformation is arranged to form a dielectric material to prevent electrical shorting between the semiconductor and a bus bar, a control board, a sensor, or a combination thereof. The particle-substrate interface associated with the agglomeration, the agglomeration, or both may be free of voids, oxide inclusions, or both. The particles may have a discrete crystalline structure. The semiconductor may be a transistor or a diode.

In yet another embodiment, a power electronics module is disclosed. The module includes a semiconducting device bound to an insulated patterned metal substrate, a dielectric material, and an electrical interconnect embedded within the dielectric material and mechanically bound to the semiconducting device via plastic deformation. The module may further include an emitter and collector sandwiching the semiconducting device, the dielectric material, and the electrical interconnect therebetween. An agglomeration of solid metal particles mechanically bound to each other and the substrate via plastic deformation is arranged to form the electrical interconnect, the dielectric material, or both. The particle-substrate interface associated with the agglomeration, the agglomeration, or both may be free of voids and oxide inclusions. The electrical interconnect includes a high current electrical interconnect, a sensor electrical interconnect, a control electrical interconnect, or a combination thereof. The semiconducting device may further include a heat sink, a heat spreader, or both. The electrical interconnect, the dielectric material, the heat sink, the heat spreader, or a combination thereof are deposited by cold spray or kinetic metallization.

DETAILED DESCRIPTION

Figure 1:
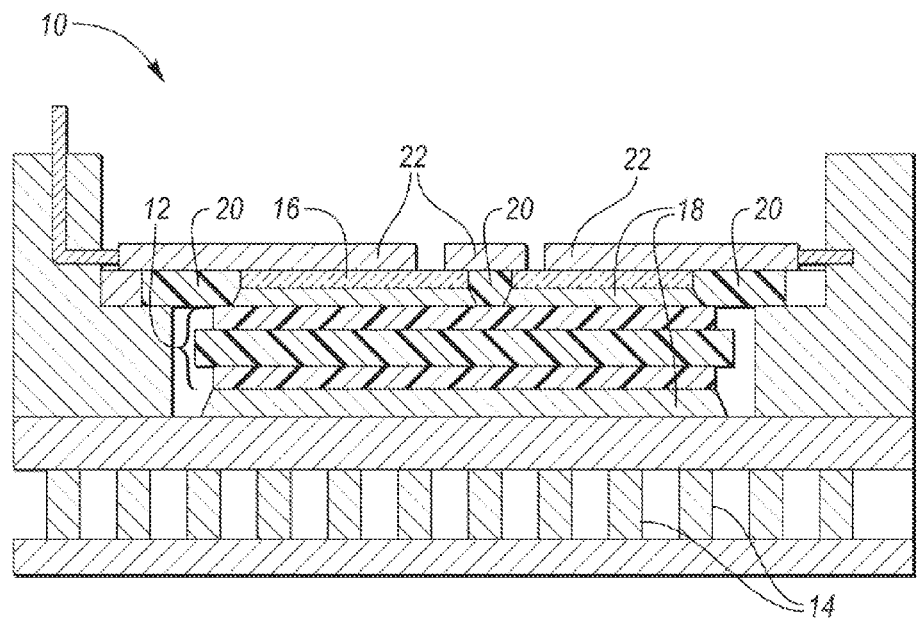
FIG. 1 depicts a schematic side view of an exemplary power electronics module according to one or more embodiments.

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Except where expressly indicated, all numerical quantities in this description indicating dimensions or material properties are to be understood as modified by the word "about" in describing the broadest scope of the present disclosure.

The first definition of an acronym or other abbreviation applies to all subsequent uses herein of the same abbreviation and applies mutatis mutandis to normal grammatical variations of the initially defined abbreviation. Unless expressly stated to the contrary, measurement of a property is determined by the same technique as previously or later referenced for the same property.

The description of a group or class of materials as suitable for a given purpose in connection with one or more embodiments of the present invention implies that mixtures of any two or more of the members of the group or class are suitable. Description of constituents in chemical terms refers to the constituents at the time of addition to any combination specified in the description, and does not necessarily preclude chemical interactions among constituents of the mixture once mixed. The first definition of an acronym or other abbreviation applies to all subsequent uses herein of the same abbreviation and applies mutatis mutandis to normal grammatical variations of the initially defined abbreviation. Unless expressly stated to the contrary, measurement of a property is determined by the same technique as previously or later referenced for the same property.

Power electronics such as an insulated gate bipolar transistor (IGBT), a gate turn off thyristor, or a power metal-oxide-semiconductor field-effect (MOSFET) transistor have become increasingly important in a variety of applications such as hybrid vehicles, power supplies, induction heating, and in other applications where there is a need to alter one form of electrical energy into another form. The packaging which provides a physical containment for the power electronics determines various properties of the power electronics modules such as their efficiency or thermal dissipation. The packaging includes all non-electrical parts required to convert an electronic circuit design into a manufacturing assembly and provides mechanical support, electrical interconnections, heat dissipation paths, protection from the outside environment etc.

A variety of techniques of power electronics modules assembly have been developed. An exemplary technique is a chip-on-board assembly during which the semiconductor devices, also called dies, are attached to a power electronic substrate by sintering or soldering. Afterwards, interconnections between the dies and its packaging are provided by wire bonding using gold, copper, silver, or aluminum. Several hundred wire-bonded interconnections can be made within one module. The assembly is finalized by encapsulating the die and the wires by applying an epoxy coating over the die and the wires. Providing interconnects via wire bonding; however, has certain disadvantages. For example, wire bonding takes up a relatively large amount of space inside of the module. Additionally, speed and electrical quality are relatively low due to extended lengths of the wire-bonded interconnections. Further still, solder cracking, electromigration, vibration, and thermal cycling or presence of hot spots present additional problems.

More recently-developed processes of power electronics modules assembly have been developed to overcome some of these disadvantages. The alternative processes include, for example, a flip-chip process, a pressure contact assembly, a thin film power overlay technology, a metal posts interconnected parallel plate structure (MPIPPS), or a multilayer integration. However, these types of assemblies suffer from other drawbacks such as a need for high thermal dissipation due to large power densities, a relatively high complexity associated with a relatively high cost, and relatively high design software requirements. Furthermore, delamination at the meeting junction of bonds with thermal cycling may occur if the interconnects are produced by wire bonding, tape/ribbon bonding, directly soldered leadframes, or other methods such as the MPIPPS. The delamination failure may occur at the solder joints where the interconnection bonding takes place.

Many of the assembly methods utilize high-temperature thermal spray processes to deposit the solderable material. The thermal spray deposition techniques are generally processes enabling layering of a wide range of feedstock material on a substrate at high deposition rates. Yet, the methods employ relatively high temperatures causing the material to melt. In thermal spray processes, the bonding mechanism is mechanical interlocking, and the bonding may be improved by increasing temperature or particle velocities. But the high processing temperatures generally increase the amount of oxides embedded in the coating, reduce the coating's performance for structural applications, and potentially damage the module. Exemplary thermal spray techniques and the temperature ranges typically associated with them include a plasma spray process with temperatures between 9,727° C. (10,000 K) and 19,727° C. (20,000 K), wire arc with temperatures of about 14,727° C. (15,000 K), detonation gun deposition utilizing temperatures of about 5,227° C. (5,500 K), or high velocity oxyfuel deposition (HVOF) with temperatures of about 5,227° C. (5,500 K).

Therefore, it would be desirable to provide electronic interconnects applied in a way which would minimize occurrence of delamination, increase reliability of the module, and enable high-temperature operations. Additionally, a module packaging decreasing parasitic capacitance and thus reducing power consumption and thermal stresses resulting in longer lifetime would be useful. An assembly method minimizing the time it takes for a signal to travel between two points within the module would be also useful. Additionally still, it would be desirable to provide a power electronics module assembly method which would improve the module's performance by reducing noise such as reflection, crosstalk, simultaneous switching, and electromagnetic interference which may inhibit quality of the signal transfer.

In one or more embodiments, depicted in FIG. 1, a power electronics module 10 is disclosed. The module 10 may represent a planar or cartridge packaging. The power electronics module 10 includes an insulated metal substrate 12 attached to a baseplate and/or a cooler 14. The module 10 further includes a semiconductor 16 bonded to the substrate 12 via any conventional bond 18. One or more layers of a dielectric material 20 are deposited onto the insulated metal substrate 12 to isolate electrical paths in which an electrically conductive material is deposited to form the power, sense, and/or control interconnects 22.

The insulated metal substrate 12 may be any substrate capable of carrying higher current, providing a higher voltage insulation up to several thousand volts, and operating at a wide temperature range of up to about 200° C. The insulated metal substrate 12 may be, for example, a direct bonded copper substrate (DBC) including a ceramic tile with a sheet of copper bonded to one or both sides; an active metal brazed substrate (AMB) having a metal foil soldered to the ceramic under high temperatures and vacuum; or an insulated metal substrate (IMS) including a metal baseplate covered by a thin layer of dielectric such as an epoxy-based layer and a layer of copper. Alternatively still, the insulated metal substrate 12 may be a printed circuit board (PCB), especially if the power module is attached to a heat sink eliminating a need for a thermally efficient substrate. An intrinsically flexible substrate including a polyimide film as a dielectric or ceramic substrates are also contemplated.

The semiconducting device 16, bonded to the substrate 12, may be any electronic component made from a semiconducting material allowing electrical current to move through the component. The semiconducting material may be inorganic such as silicon, germanium, selenium, gallium arsenide, silicon carbide, gallium nitride, gallium phosphide, cadmium sulphide, lead sulphide, or include various organic materials such as poly(3-hexylthiophene), poly(p-phenylene vinylene), polyacetylene and its derivatives, etc. Exemplary semiconducting devices 16 include diodes having two electrical terminals and transistors capable of amplifying or switching electronic signals and electrical power having at least three terminals for connection to an external circuit.

The dielectric material 20 may be any suitable insulating material which can be polarized by an applied electric field such that the electric charges do not flow through the material. The dielectric material 20 may be polymeric such as polyimide, fluorinated polyimide, polyamide, methylsilsesquioxane, polyarelene ether, polyethylene, polypropylene, polycarbonate, polysulfone, polystyrene, polytetrafluoroethylene, or $Al_2O_3$ (sapphire), $Al_6Si_2O_{13}$ (mullite), $ZrO_2$ (baddeleyite), $HfO_2$, $Y_2O_3$, etc. Other insulating materials are contemplated such as $AlN$—$Si_3N_4$ or $AlN$—$Si_3N_4$—($Ni$—$Cr$—$Al$) layers.

Figure 6A:
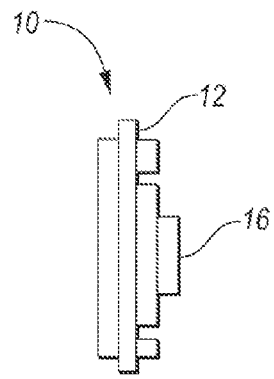
FIGS. 6A and 6B depict a schematic top view of an insulated metal substrate including a semiconductor.
Figure 6B:
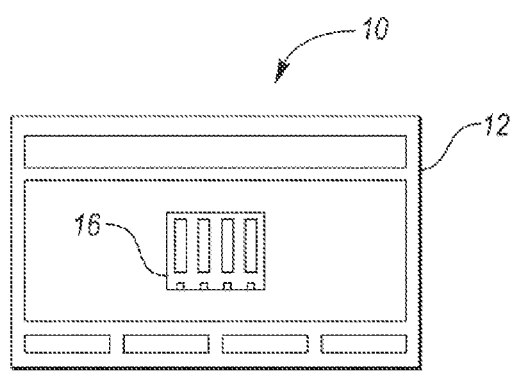
Figure 6C:
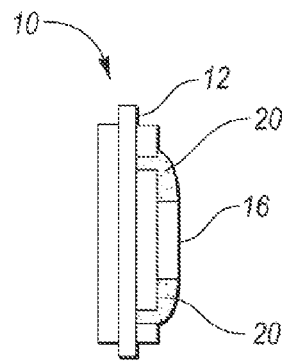
FIGS. 6C and 6D depict a schematic top view of the substrate depicted in FIGS. 6A and 6B bonded to a dielectric material.
Figure 6D:
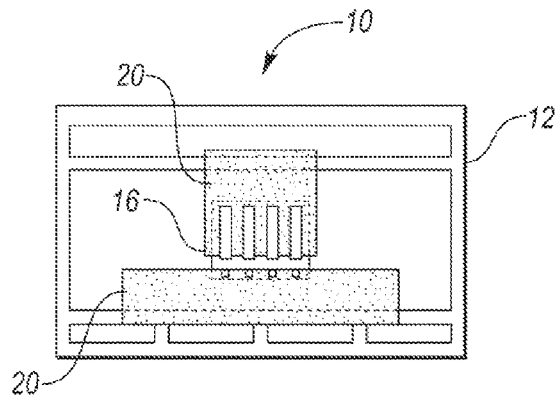
Figure 6E:
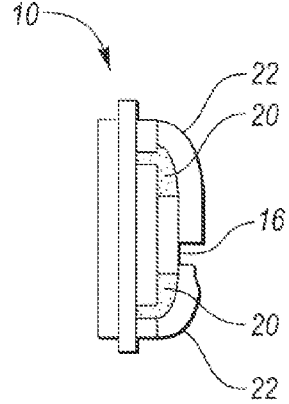
FIGS. 6E and 6F depict a schematic top view of the substrate shown in FIGS. 6C and 6D with electrical interconnects.
Figure 6F:
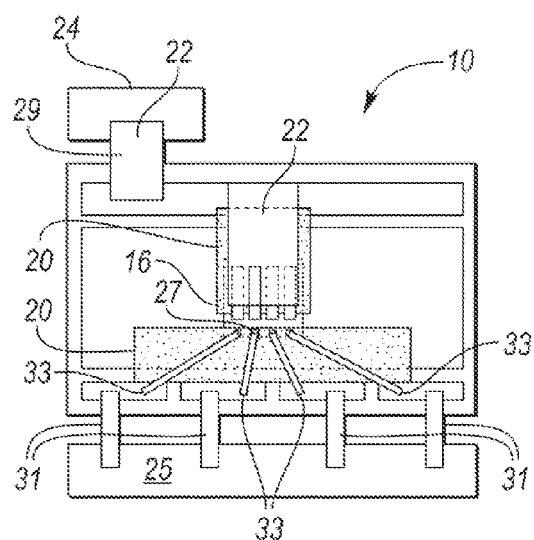

The interconnects 22 join the semiconductor 16 and a bus bar 24, a control board 25, or a sensor 27, which are depicted in FIGS. 6E and 6F. The sensor 27 may be a temperature sensor, a current sensor, a voltage sensor, or the like. The interconnects 22 may thus form high current electrical interconnects 29, control electrical interconnects 31, or sensor electrical interconnects 33. The interconnects 22 may be formed from any suitable conductive material such as copper or aluminum.

The dielectric material 20, the interconnects 22, or both may be formed as an agglomeration 26 of solid particles 28 mechanically bound to each other and the substrate 12 via plastic deformation. The agglomeration 26 of particles 28 may be achieved using a cold spray deposition method also called gas dynamic cold spray (GDCS). The cold spray deposition is an impact consolidation method. The cold spray deposition differs from hot spray processes mentioned above by using a much lower temperature such as ambient temperature of about 24° C. (297.15 K) to about 80° C. (353.15 K) such that the material which is being deposited onto a substrate remains in a compliant, but solid state. The temperature may be increased beyond the range named above to achieve higher pliability and softness of the particles 28 as long as the elevated temperature is below the melting point of the particles 28 and the substrate 12. Thus, the cold spray deposition is a process of depositing particles 28 without a phase change. Since there is no phase change, all particles 28 in the agglomeration 26 have the same thermo-mechanical history which leads to uniform properties of the dielectric material 20 and/or the interconnects 22.

Figure 2:
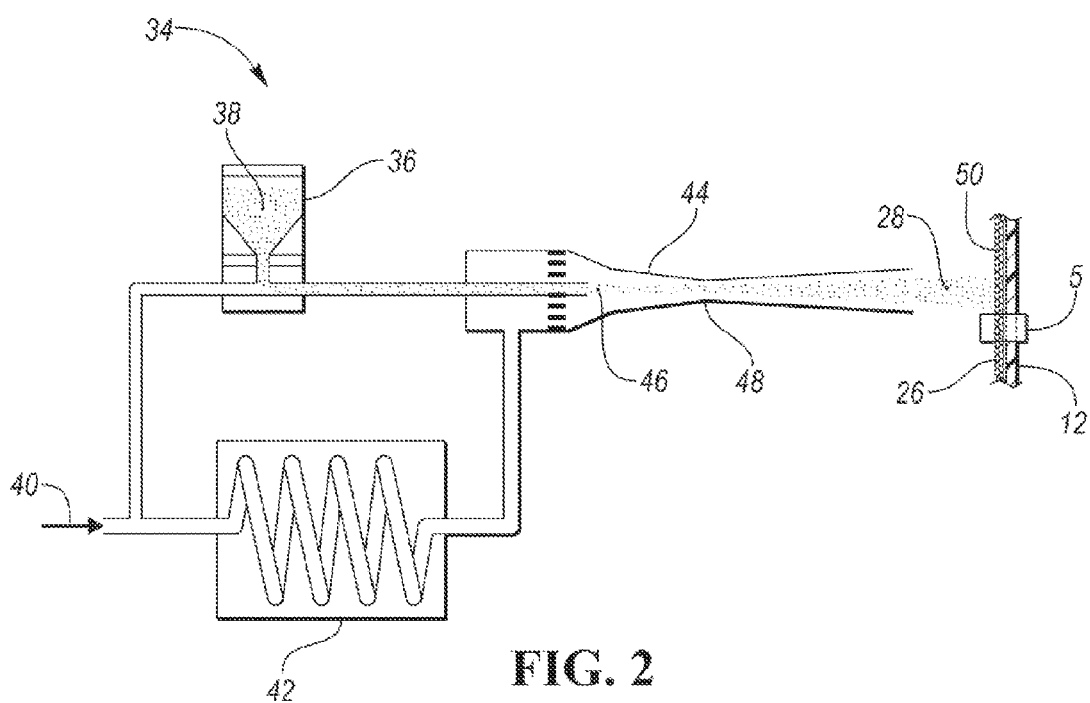
FIG. 2 depicts a side schematic view of an exemplary cold spray system including an agglomerate-substrate interface produced in the cold spray system.

During a cold spray deposition process, powdered metal particles 28 are deposited on a substrate 12 by ballistic impingement at supersonic velocities to form a layered coating 30 or a free-form structure 32. An exemplary schematic depiction of a cold spray system 34 can be seen in FIG. 2. The system 34 includes a powder feeder 36 for accepting a powder feed 38 having particle size of about 1-100 µm in diameter. The feed may be a powder including metals such as Mg, Al, Si, Sc, Ti, V, Cr, Mn, Fe, Co, Ni, Cu, Zn, Zr, Nb, Mo, Rh, Pd, Ag, In, Sn, Hf, Ta, W, Ir, Pt, Au, Re, polymers, ceramics, composite materials, metal matrix composite materials, nanocrystalline materials, or a mixture thereof. Individual particles of the feed may be soft, hard, rigid, smooth, rough, or the like.

Exemplary powder feed rate may be 1-10 pounds/hour. The system 34 further includes a gas inlet 40 for supplying gas capable of entraining the solid particles 28. The gas may be, for example, $N_2$, He, their mixture, or the like. A heater 42 is provided for heating the entraining gas to about 100-500° C. to increase ductility of the particles 28 to be deposited onto the substrate 12. The gas flow rate may be about 30-100 CFM. The powder feed 38 is inserted at high pressure and temperature at the entrance of the supersonic nozzle 44. The gas expands and accelerates through the nozzle 44 as its temperature decreases. Rapid changes take place at the nozzle throat 48, where gas supersonic velocity is reached. The velocity and temperature of the solid particles 28 approach gas values as heat transfer occurs.

The high pressure and temperature produced within the cold spray system 34 are capable of yielding supersonic gas velocities such as about 300-1500 m/s and high particle acceleration within the gas stream 46. The solid particles 28 are entrained within the gas stream 46 and directed towards the substrate 12, where they embed on impact and form a strong bond with the surface of the substrate 12. The kinetic energy of the particles 28, supplied by the expansion of the gas, is converted to plastic deformation energy during bonding. To achieve particle consolidation with the surface, a critical velocity must be reached before impact of the particles 28 with the substrate 12. The critical velocity differs depending on the feed type. Because the particles 28 remain in their solid state and undergo plastic deformation, their shape may become lenticular on impact, as is depicted in FIGS. 3A-3D. FIGS. 3A-3D illustrate a sequence of changes at the particle-substrate interface 49 upon the solid particle's 28 impact with the surface of the substrate 12. As can be seen in the FIGS. 3A-3D, when the particle 28 encounters the substrate, the particle 28 flattens while a crater 52 forms in the substrate 12. The depth and width of the crater 52 increases with time such that $w_1 < w_2$ and $h_1 < h_2$.

At the same time, the temperature at the impact zone rises, the rise being concentrated at the particle-surface interface 49. Yet, the discrete crystalline structure of the solid particle 28 is preserved upon impact. The resulting connection between the solid particles 28 and the substrate 12 produces a mechanical mixing at the particle-substrate interface 49 similar to explosive bonding.

Figure 3A:
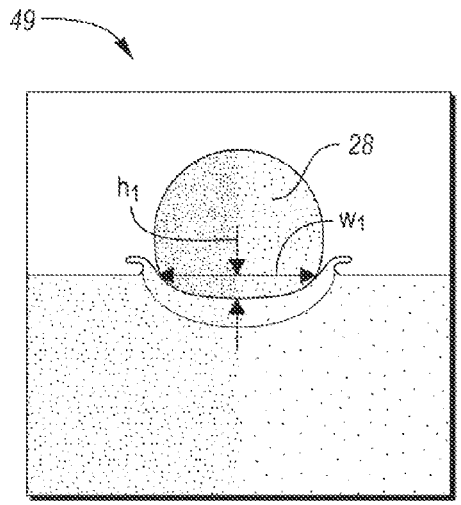
FIGS. 3A-3D depict changes in a particle-substrate interface upon impact of a solid particle with a surface of a substrate during a cold spray deposition process.
Figure 3B:
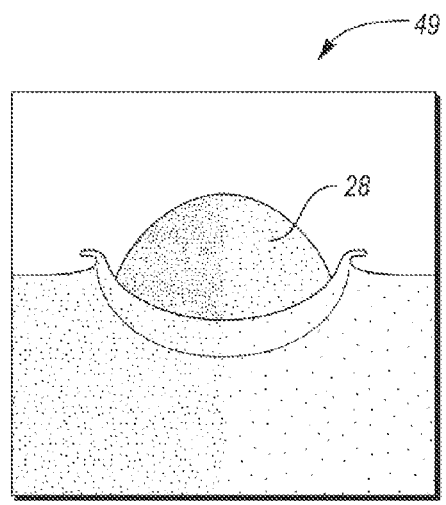
Figure 3C:
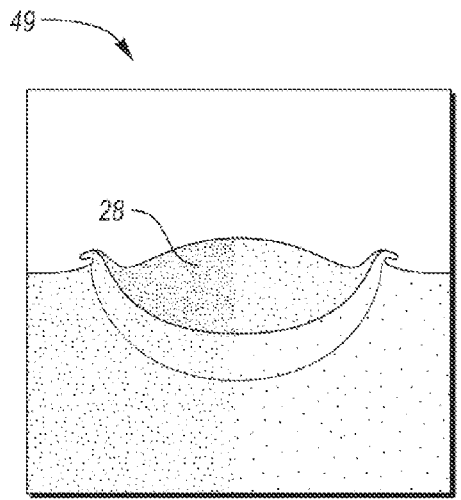
Figure 3D:
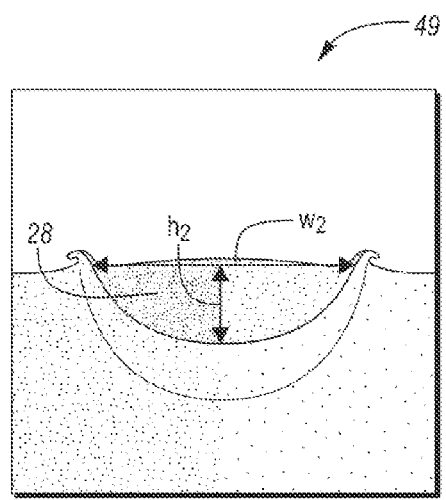
Figure 4:
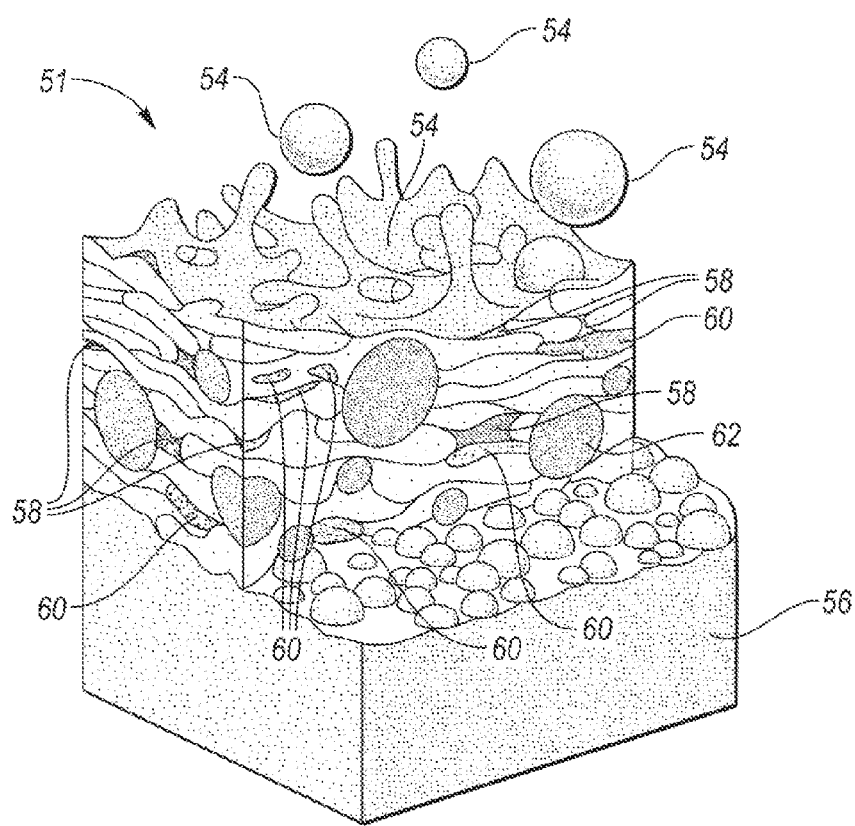
FIG. 4 depicts a perspective schematic view of a coating-substrate interface produced by a thermal spray deposition process.

In contrast to the cold spray deposited particles 28 depicted in FIGS. 3A-3C, a coating-substrate interface 51 of thermally sprayed molten particles 54 deposited on a substrate 56 are illustrated in FIG. 4. The resulting structure includes molten particles/material 54, voids 58, as well as oxide inclusions 60 and unmelted particles 62.

Figure 5:
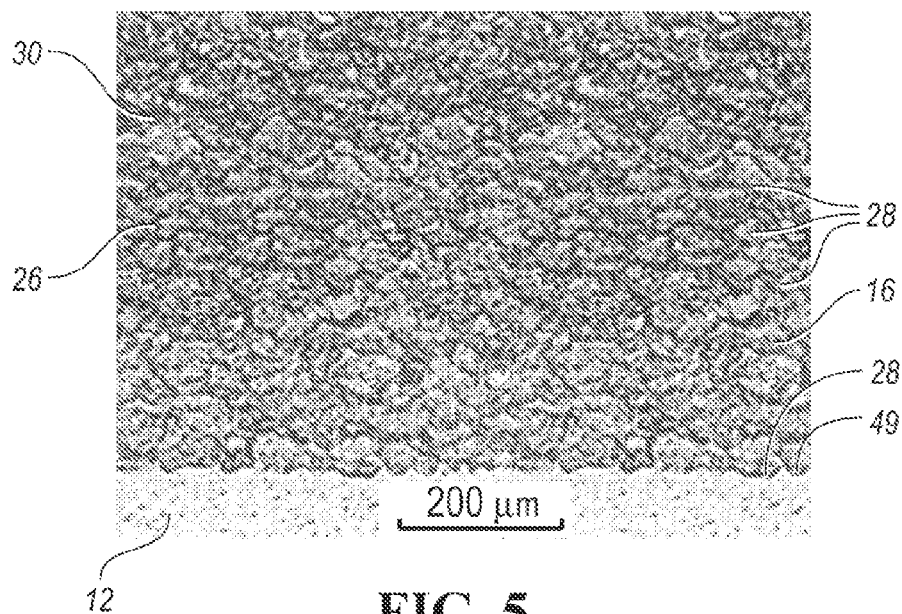
FIG. 5 depicts a schematic detailed view of the agglomerate-substrate interface depicted in FIG. 2.

Advantageously, the mechanical mixing does not allow for presence of voids 58, typically associated with the coating-substrate interface 51 created by the thermal spray processes, at the particle-substrate interface 49. An exemplary consolidated deposit of solid powder particles 28 forming the interconnects 22 as a void-free structure can be seen in FIG. 5. As can be further seen in FIG. 5, the thickness of the deposited particle layer, or the agglomerate 26, may be increased by supplying an additional amount of solid particles 28. In the formed agglomeration 26, the additional amount of particles 28 mechanically mix with the already deposited solid particles 28. No voids are created within the agglomerate 26. In contrast, a thermally sprayed coating including oxide inclusions and voids is depicted in FIG. 5. The particle-substrate interface 49 as well as the particle-particle interface 50 are free of voids and oxide inclusions.

Since the interconnects 22 and/or the dielectric layers 20 may be made from materials that are sensitive to the presence of oxygen and will readily oxidize at elevated temperatures such as copper and aluminum, the thermal spray processes may produce interconnects 22 of inferior quality. Yet, melting of the particles that occurs during most thermal spray processes, and which may result in oxidation of the coating and the substrate and thus lower performance of the module, is not present in the cold spray process. The agglomerate 26 and the particle-substrate interface 49, produced during the cold spray process, are thus free of oxide inclusions 60 which could otherwise decrease the adhesive and cohesive strength of the coating 30. The cold-sprayed dielectric material 20, the interconnects 22, or both are thus deposited as a dense coating 30 with low oxide content of less than about 0.3 to 0.5%. The coating 30 is a non-porous or low-porous structure having porosity of less than about 0.5 to 2%. Yet, the coating 30 has physical characteristics such as strength comparable or surpassing those of some wrought materials. Exemplary adhesive strength of the particles 28 to one another and to the substrate 12 may be about 10 to 60 MPa or more, about 15 to 40 MPa or more, or about 15 to 25 MPa or more.

In one or more embodiments, a method for direct cold spray deposition of electrical interconnects 22 and/or dielectric material 20 is disclosed. The sequence of the method steps is depicted in FIGS. 6A-6F and includes providing a patterned insulated metal substrate 12, example of which is depicted in FIGS. 5A and 5B. As can be seen in the figures, a semiconductor 16 is attached to the substrate 12. The attachment may be provided by a conventional method such as soldering or otherwise. In FIGS. 6C and 6D, a dielectric material 20 is attached to the substrate 12 to protect and/or create paths into which the interconnects 22 are later deposited. The dielectric material 20 may be cold spray deposited by the method described above. To cold spray the dielectric material 20 in a desired pattern, a mask may be utilized.

Alternatively, the dielectric material 20 may be layered via evaporation, sputtering, sintering, plasma deposition, low-pressure CVD, or the like, prior to attachment of the semiconductor 16 to the substrate 12. If the cold spray deposition is utilized, the dielectric material 20 is applied as an agglomeration of solid particles 28 mechanically intermixed with the substrate 12, the agglomeration 26 being free of voids and/or oxide inclusions. The dielectric material 20 may form one or more layers of varying dimensions, shapes, and configurations, as FIGS. 6C and 6D further illustrate.

Subsequently, as is shown in FIGS. 6E and 6F, the interconnects 22 are applied by the cold spray method described above on the insulated metal substrate 12 and/or the dielectric material 20. The interconnects 22 are applied in a predetermined pattern to form various types of interconnects 22. For example, the cold-sprayed interconnects 22 may be high current electrical interconnects 29, control electrical interconnects 31, or sensor electrical interconnects 33. A mask may be used to assist with the cold spray deposition of the interconnects 22 in the desirable pattern. The dimensions such as height, width, and length of the individual interconnects 22 may be varied according to the needs of a particular application. Likewise, at least some of the interconnects may be made from a different material than the remaining interconnects 22. All of the interconnects 22 may be formed at the same time, or a first portion of interconnects 22 may be formed prior to cold spray deposition of a second portion of interconnects 22. The cold-sprayed interconnects 22 may be planar, compact structures applied as a relatively flat coating 30 and thus may be more space-efficient than the typical wire-bonded interconnects. This, in turn, allows for downsizing of the entire module 10.

Figure 7A:
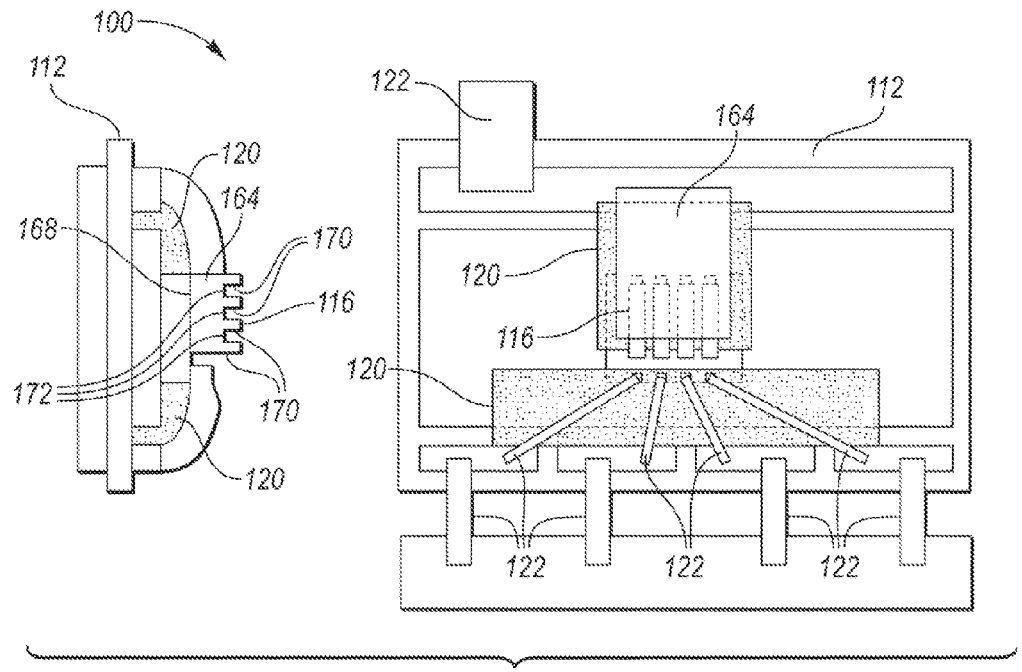
FIG. 7A depicts a schematic top view of an insulated metal substrate with a heat sink.
Figure 7B:
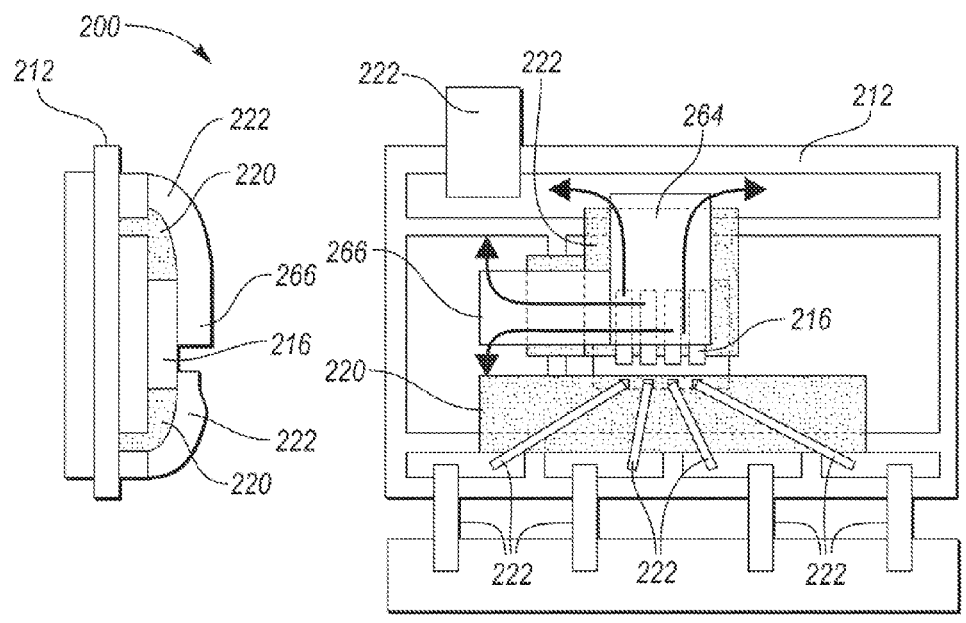
FIG. 7B depicts a schematic top view of an insulated metal substrate including a heat spreader.

In at least one embodiment, depicted in FIGS. 7A and 7B, the cold spray deposition technique may be utilized to form a layered free-form structure 132 for passive cooling of the module 100. The free-form structure 132 may be designed to assist with thermal management of the module 100 and thus increase its performance reliability and life expectancy as both of these properties are inversely related to the operating temperature of the module's semiconductor 116. The free-form structure 32 may enable effective control of the semiconductor's operating temperature within the set limits.

The free-form structure 132 may be a heat sink 64, depicted in FIG. 7A, or another cooling device capable of enhancing heat dissipation from a heat-generating component of the module 100 to a coolant such as air. The module includes a substrate 112 onto which the dielectric material 120 and various electrical interconnects 122 are applied by cold spray deposition, as was described above. As can be further seen in FIG. 7A, the heat sink 164 is formed as an agglomeration of solid particles on the semiconductor 116, the substrate 112, the interconnects 122, or a combination thereof. The heat sink 164 includes one or more flat surfaces 168 to ensure proper contact with the semiconductor 116 to be cooled. Additionally, the heat sink 164 includes one or more protrusions 170 and depressions 172 to increase the surface contact with the coolant and thus increase the rate of heat dissipation. The protrusions 170 may be shaped liked pin fins, plate fins, a comb, the like, or a combination thereof. The depressions 172 are regions between two adjacent protrusions 170. The density, profile, dimensions, and configuration of the protrusions 170, depression 172, or both may be designed to achieve the optimum heat transfer coefficient. The heat sink 164 may be coupled to a fan (not depicted) to increase the cooling rate even further.

Additionally, the free-form structure may be formed as an integrated heat spreader 266, shown in FIG. 7B. A substrate 212, depicted in FIG. 7B, bonded to a semiconductor 216 further includes the dielectric material 120 and various electrical interconnects 122 applied by cold spray deposition, as was described above. The heat spreader 266 is formed as an agglomeration of solid particles on the semiconductor 216, the substrate 212, the interconnects 222, or a combination thereof. The heat sink 264 is an effective way how to reduce hot spots, or points of excessive temperature, by extracting the heat from a heat source, where the heat is concentrated to a limited volume, and spread the heat over a large area. The heat-spreader 266 may serve as an interface between a heat source, the semiconductor 216, and a heat sink 264. The heat spreader 266 collects heat from the semiconductor 216 and spreads the heat in a minimum amount of time to the surface of the heat sink 264.

The free-form structure 132 or 232 may be formed after the dielectric material 120, 220 and interconnects 122, 222 are deposited. In the alternative, the free-form structure 132, 232 may be applied at the same time as at least some of the interconnects 122, 222 are being formed. The cold spray deposition allows to modify the free-form structure's height, base width, profile, configuration, geometry, dimensions, or a combination thereof to meet specific thermal requirements. Furthermore, the free-form structures 132, 232 may be made from any suitable material capable of thermal spreading, eliminating hot spots within the module, and mitigating temperature gradient of the module packaging. Exemplary materials may be high thermal conductivity materials such as aluminum, copper, silver, gold, copper/tungsten, copper/molybdenum, copper/carbon, aluminum/silicon carbide, or a combination thereof. Other materials such as a metal matrix composite or a polycrystalline diamond film including, but not limited to, a diamond-reinforced copper-matrix composite film, are contemplated, especially for the formation of a heat spreader 266.

The free-form structures 132, 232 applied by the cold spray method described above help to ensure that the free-form structures' 132, 232 base is flat and smooth so that the best thermal contact with the semiconductor 116, 216 is achieved. Additionally, the cold spray process affords sufficient adhesion strength to the bond between the cold sprayed-particles forming the free-form structure 132, 232 and the substrate the particles are being deposited onto such as the semiconductor 116, 216, the insulated metal substrate 112, 212, the semiconductor 116, 216, the dielectric 120, 220, the interconnects 122, 222, or a combination thereof.

Figure 8A:
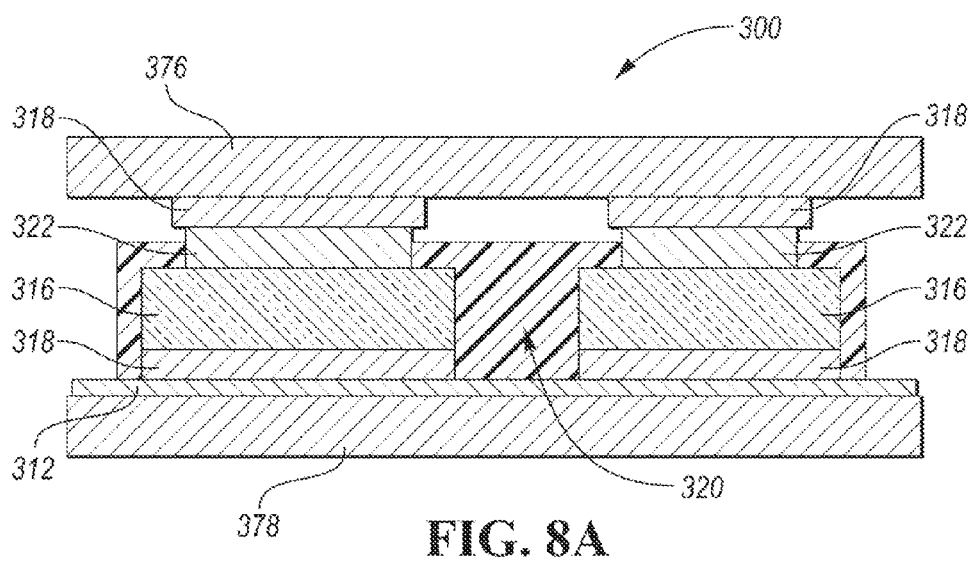
FIG. 8A depicts a schematic side view of an electronics power module according to one or more embodiments.

In yet another embodiment, shown in FIG. 8A, a power electronic module 300 is disclosed. The module 300 may be a cartridge-type power electronic package. The module 300 includes a semiconductor 316 attached to a substrate 312, a dielectric material 320, one or more electrical interconnects 322 embedded within the dielectric material 320 and mechanically bound to the semiconductor 316 via plastic deformation. The module 300 further includes an emitter 376 and a collector 378 sandwiching the semiconductor 316, the dielectric material 320, and the electrical interconnects 322 there between. The semiconductor 316 may be interfaced from the bottom via an insulated metal substrate (not depicted) and from the top via the electrical interconnects 322. The dielectric material 320 is thus deposited between the insulated metal substrate and the electrical interconnects 322 which are connected to the emitter 376 via solder bonds 318.

Figure 8B:
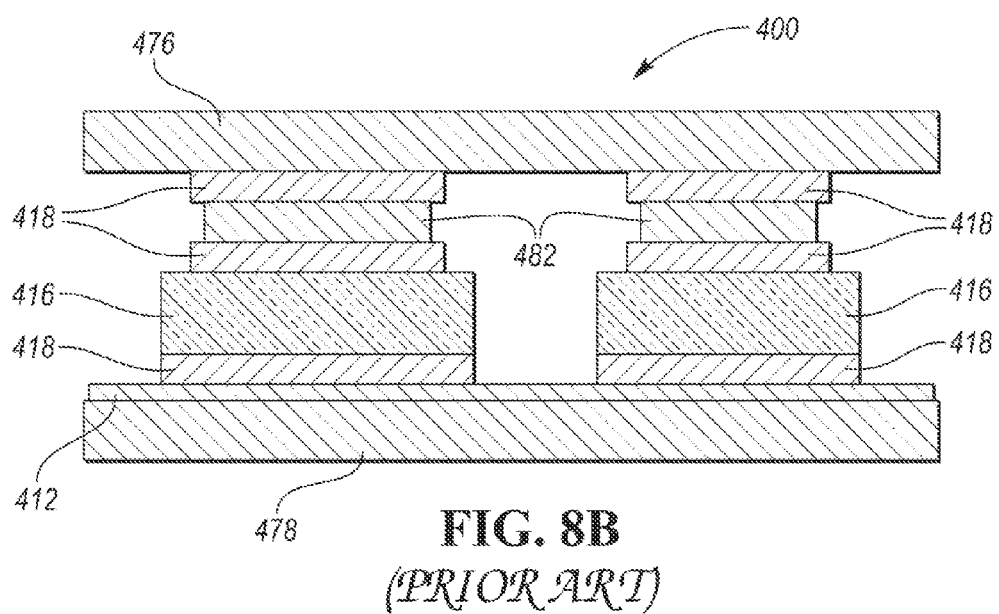
FIG. 8B depicts a schematic side view of a prior art power electronics module.

In comparison to a traditional structure of the cartridge-type power electronics module 400 depicted in FIG. 8B, the module 300, depicted in FIG. 8A, provides a cold spray deposited dielectric material 320 and/or cold spray deposited electrical interconnects 322 such that dielectric material 320 and/or the interconnects 322 form an agglomeration of solid metal particles mechanically bound to each other and the substrate via plastic deformation. Additionally, the module 300 eliminates the need for an extra solder 418 between the semiconductor 416 and the semiconductor spacer 482 of the module 400. The extra solder 418 typically has an undesirable heat spreading effect. Additionally, the soldered layer 418 is usually free-form, having varying thickness which may cause tilting of the spacer layer 482 which is applied on top of the solder layer 418. By eliminating the solder layer 418, better control of height and overall dimensions of the module may be achieved. The addition of the cold-sprayed dielectric 320 and interconnects 322 into the module 300, depicted in FIG. 8A, provides further control of the height, reduction in potential deformation and roughness of the surfaces within the module 300. Additionally, the mechanical intermixing among the particles and the substrate ensure superior adhesion.

While the dielectric material and/or the interconnects of the modules 100, 200, 300 may be formed by any type of cold spray deposition technique, a kinetic metallization process may provide a number of advantages. For example, the kinetic metallization process operates at sonic speeds and pressures of about 50 to 130 psig, which is lower than some other cold spray methods which require up to 700 psig. The lower pressure enables to perform the process while using smaller amount of gas such as up to 1/10 of the gas needed in other types of cold spray methods.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

What is claimed is:

1. A power electronics module comprising:
    an insulated patterned metal substrate;
    a semiconductor on the substrate;
    an agglomeration of solid metal particles, mechanically bound to each other and the substrate, arranged to form electrical interconnects between the semiconductor and a bus bar, a control board, or a sensor; and
    an additional agglomeration of solid particles, mechanically bound to each other via plastic deformation, arranged to form a dielectric between the substrate and interconnects.

2. The module of claim 1, wherein the additional agglomeration of solid particles mechanically bound to each other and the substrate via plastic deformation is mechanically bound to the semiconductor via plastic deformation.

3. The module of claim 1, wherein a particle-substrate interface associated with the agglomeration is free of voids and oxide inclusions.

4. The module of claim 1, wherein the agglomeration is free of voids, oxide inclusions, or both.

5. The module of claim 1, wherein the particles have a lenticular shape.

6. The module of claim 1, wherein each of the particles has a discrete crystalline structure.

7. The module of claim 1, wherein the semiconductor is a transistor or a diode.

8. A power electronics module comprising:
an insulated patterned metal substrate;
a semiconductor bonded directly to the substrate;
an agglomeration of solid metal particles mechanically bound to each other and the substrate via plastic deformation, and arranged to form a heat sink, a heat spreader, or both in thermal communication with and configured to dissipate heat generated by the semiconductor; and
an additional agglomeration of solid particles, mechanically bound to each other and the substrate via plastic deformation, arranged to form a dielectric.

9. The module of claim 8, wherein the agglomeration comprises high thermal conductivity materials.

10. The module of claim 8, wherein an additional agglomeration of solid metal particles mechanically bound to each other and the substrate via plastic deformation is arranged to form a high current electrical interconnect, a sensor electrical interconnect, a control electrical interconnect, or a combination thereof.

11. The module of claim 8, wherein the dielectric prevents electrical shorting between the semiconductor and a bus bar, a control board, a sensor, or a combination thereof.

12. The module of claim 8, wherein a particle-substrate interface associated with the agglomeration, the agglomeration, or both are free of voids, oxide inclusions, or both.

13. The module of claim 8, wherein each of the particles has a discrete crystalline structure.

14. The module of claim 8, wherein the semiconductor is a transistor or a diode.

15. A power electronics module comprising:
a semiconducting device bound to an insulated patterned metal substrate;
an agglomeration of solid metal particles mechanically bound to each other and the substrate via plastic deformation is arranged to form a dielectric;
an electrical interconnect embedded within the dielectric and mechanically bound to the semiconducting device via plastic deformation; and
an emitter and collector sandwiching the semiconducting device, the dielectric, and the electrical interconnect therebetween.

16. The module of claim 15, wherein an agglomeration of solid metal particles mechanically bound to each other and the substrate via plastic deformation is arranged to form the electrical interconnect.

17. The module of claim 16, wherein a particle-substrate interface associated with the agglomeration, the agglomeration, or both are free of voids and oxide inclusions.

18. The module of claim 15, wherein the electrical interconnect includes a high current electrical interconnect, a sensor electrical interconnect, a control electrical interconnect, or a combination thereof.

19. The module of claim 15, further comprising a heat sink, a heat spreader, or both.

20. The module of claim 19, wherein the electrical interconnect, the dielectric, the heat sink, the heat spreader, or a combination thereof are deposited by cold spray or kinetic metallization.

* * * * *